United States Patent [19]
Pattantyus et al.

[11] Patent Number: 5,404,303
[45] Date of Patent: Apr. 4, 1995

[54] SOLENOID CURRENT DRIVER CIRCUIT

[75] Inventors: Tamas I. Pattantyus, North Olmsted; Steven J. Griggs, Elyria, both of Ohio

[73] Assignee: AlliedSignal Truke Brake Systems, Morristown, N.J.

[21] Appl. No.: 196,053

[22] Filed: Feb. 14, 1994

[51] Int. Cl.6 .................................................. B60T 8/32
[52] U.S. Cl. .................... 364/426.02; 364/426.03
[58] Field of Search ...................... 364/426.02, 426.03, 364/426.01; 361/154; 303/100; 188/195

[56] References Cited

U.S. PATENT DOCUMENTS

| | | | |
|---|---|---|---|
| 3,653,728 | 4/1972 | Sarbach | 188/195 |
| 3,953,083 | 4/1976 | Latvala et al. | 303/21 P |
| 4,223,651 | 9/1980 | Eshelman et al. | 123/438 |
| 4,225,898 | 9/1980 | Weber et al. | 361/154 |
| 4,511,945 | 4/1985 | Nielsen | 361/154 |
| 4,620,565 | 11/1986 | Brown | 137/596.17 |
| 4,631,628 | 12/1986 | Kissel | 361/154 |
| 4,778,227 | 10/1988 | Bayliss | 303/119 |
| 4,903,576 | 2/1990 | Hofler et al. | 91/459 |
| 4,939,656 | 7/1990 | Hoashi et al. | 364/426.02 |
| 4,949,215 | 8/1990 | Studtmann et al. | 361/154 |
| 5,004,300 | 4/1991 | Brearley et al. | 303/15 |
| 5,043,896 | 8/1991 | Sol | 364/426.02 |
| 5,050,940 | 9/1991 | Bedford et al. | 303/100 |
| 5,072,393 | 12/1991 | Mori et al. | 364/426.02 |
| 5,072,995 | 12/1991 | Kawamura et al. | 303/100 |
| 5,102,205 | 4/1992 | Stegmaier | 303/113 TR |
| 5,133,593 | 7/1992 | Woerner | 303/118 |
| 5,135,291 | 8/1992 | Hee | 303/113 SS |
| 5,150,299 | 9/1992 | Fujioka | 364/426.02 |
| 5,169,213 | 12/1992 | Matsuda et al. | 303/113.2 |
| 5,255,962 | 10/1993 | Neuhaus et al. | 364/426.02 |
| 5,257,192 | 10/1993 | Masaki | 364/426.02 |

FOREIGN PATENT DOCUMENTS 0256665 7/1987 European Pat. Off. .

Primary Examiner—Kevin J. Teska
Assistant Examiner—Stephen J. Walder, Jr.
Attorney, Agent, or Firm—Leo H. McCormick, Jr.

[57] ABSTRACT

A brake pressure control mechanism for establishing a pressure level in a brake actuator includes a valve controlled by the current in a solenoid coil. The current in the coil is controlled in a first mode by switching the current in the coil off and on and allowing the current to increase and decay in the normal manner. However, when a fast decrease in brake pressure is demanded, the fly-back voltage across the coil is allowed to rapidly increase to a level greater than and in opposition to the voltage applied to the coil, thereby quickly driving the current lower. Current is driven to zero in the case of a fast brake pressure decay being demanded by the adaptive braking system or when the vehicle operator releases the brakes. When the error signal demands a fast decay, the fast decay mode is initiated and then returned to the normal control when the error between the demanded braking pressure and the pressure corresponding to the current of the coil is back within predetermined limits.

15 Claims, 2 Drawing Sheets

SOLENOID CURRENT DRIVER CIRCUIT

This invention relates a brake pressure control mechanism for an electronically controlled braking system.

It has been proposed that heavy vehicles equipped with braking systems actuated by compressed air also be equipped with a system which controls the brakes electronically instead of pneumatically. Such a system is disclosed in U.S. Pat. No. 4,749,238. Such electronically controlled braking systems require a brake pressure controller or modulator which control braking pressure in accordance with signals generated by the electronic braking system. These modulators include a linearly variable solenoid valve, that is, a solenoid valve in which the valve orifice is determined by the current in the solenoid or coil, which controls the position of the valve element. The current and output pressure of the solenoid valve are in a quasi-linear relationship. Although the systems have been proposed for heavy vehicles, the technology is also applicable to possible smaller vehicles, such as passenger cars and light trucks, which are equipped with hydraulic braking systems.

It is well known that the current in a solenoid coil increases and decreases at an exponential rate governed by the voltage applied to the coil, inductance of the coil, and the resistance in the circuit, as will be discussed hereinafter. Normally, this permitted rate of increase is sufficiently great that brake pressure increases or decreases at a rate that is satisfactory. However, there are times in which the current in the coil must be abruptly reduced at a rate greater than that normally permitted by the physical characteristics of the circuit and the applied voltage. This would occur, for example, when the vehicle operator abruptly reduces the desired braking pressure, when intervention of the vehicle adaptive braking system demands a rapid brake pressure decrease in order to alleviate an incipient skidding condition, or when the vehicle operator releases the brakes. It is desirable that the braking pressure be immediately decreased in such circumstances, but this rate of decrease is often larger than that permitted by the rate of current decay in the solenoid coil. The present invention solves this problem by using the inductive fly-back voltage to cause a reversal of the voltage drop across the coil, thereby immediately reducing the current through the coil at a rate much greater than that permitted by the normal physical characteristics of the coil and the applied voltage, which is usually the battery voltage of the vehicle.

This and other advantages of the present invention will become apparent from the following description, with reference to the accompanying drawings, in which.

Figure 1:
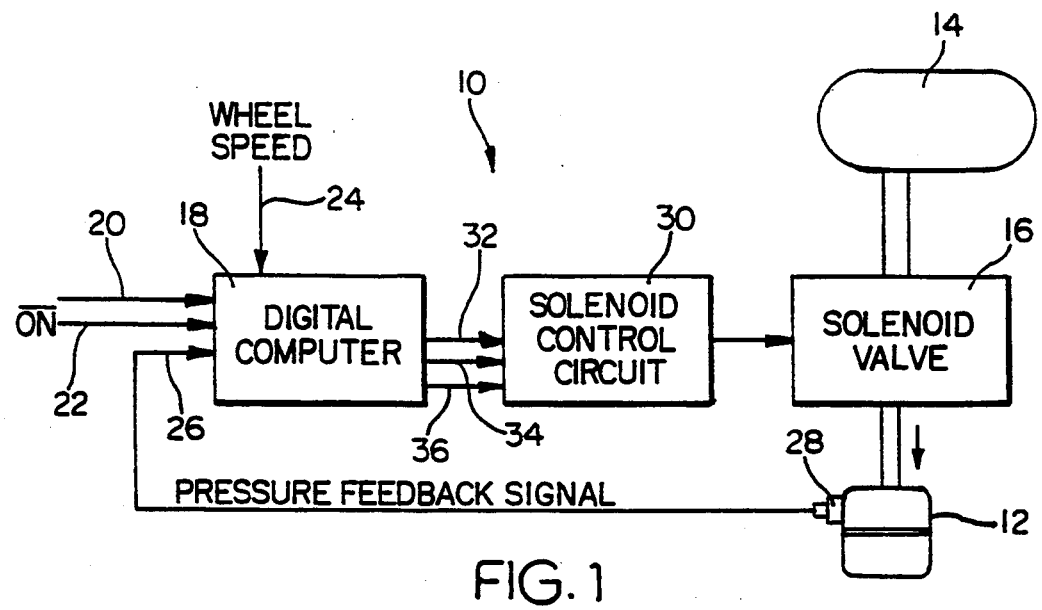
FIG. 1 is a schematic illustration of a brake pressure control system made pursuant to the teachings of the present invention.

Referring now to the drawings, a brake pressure control system generally indicated by the numeral 10 includes a pressure responsive brake actuator generally indicated by the numeral 12, an air reservoir 14, and a solenoid valve 16 which controls communication between the reservoir 14 of the brake chamber 12. A digital computer 18 receives a brake pressure request input signal 20, which varies in accordance with the brake pressure demanded by the vehicle operator. Computer 18 also receives a "brake off" input signal 22, which is generated when the vehicle operator releases the brake. Computer 18 also receives wheel speed signals on input 24 from one or more of the vehicle wheels and processes these wheel speeds, in a manner known to those skilled in the art, to control the brakes of the vehicle adaptively during an incipient skidding condition. Digital computer 18 further receives a pressure feedback signal on input 26 which is generated by a pressure sensor 28 which generates a signal which varies in accordance with the pressure level in the brake chamber 12. The computer 18 processes these signals and transmits control signals to the solenoid control circuit generally indicated by the numeral 30. The signals transmitted to the solenoid control circuit include a SET POINT input 32, which is generated as a function of the brake pressure request signal on input 20 and the pressure feed back signal on input 26. Signals transmitted to the control circuit 30 further include an adaptive braking decay signal 34, which is generated when an incipient skidding condition calls for a full decay of the vehicle braking pressure. The input 36 merely transmits the "brake not on" signal from the input 22.

Figure 2:
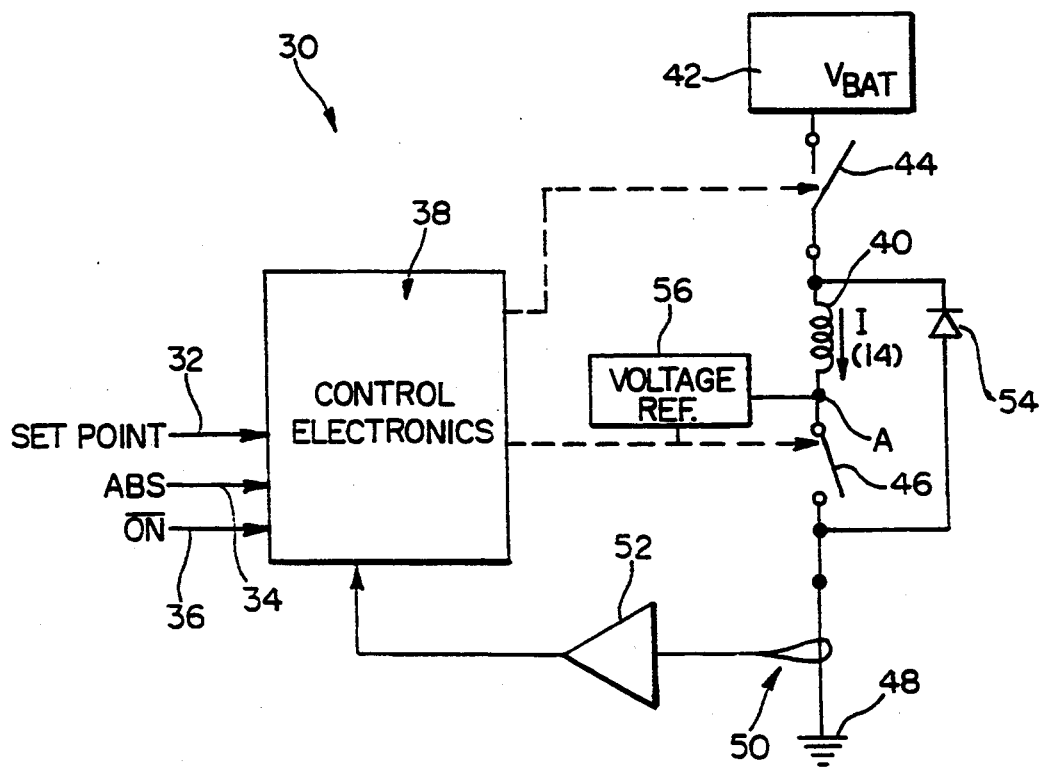
FIG. 2 is a schematic diagram of the solenoid control circuit used in the system illustrated in FIG. 1.

Referring now to FIG. 2, the control electronics generally indicated by the numeral 38 and which will be described in more detail with respect to FIG. 3 controls current in a solenoid coil 40 in accordance with the signals on inputs 32, 34 and 36. The battery voltage of the vehicle indicated at 42 is connected to one side of the solenoid coil 40 through a transistor switch illustrated schematically at 44. A second electronically actuated transistor switch generally indicated by the numeral 46 connects the other side of the coil 40 with ground as indicated at 48. The transistor switch 46, as will be described hereinafter in detail, is a specialized MOSFET and includes a current sensor generally indicated by the numeral 50 that senses current through the coil 40. The current sensor feeds a signal through a differential amplifier 52 that represents fluctuations in the current though the coil 40. The output of the current sensor 50 is fed back to the control electronics 38 through the operational amplifier 52. A diode 54 is connected around the coil 40 and transistor switch 46. A voltage referencing and clamping circuit generally indicated by the numeral 56 is responsive to the signal from the control electronics 38 opening the switch 46 to clamp and hold a voltage level (when the solenoid 40 is controlled in the fast decay model on the other side of the coil 40 that is a predetermined magnitude higher than the battery voltage 42, as will hereinafter be described. The voltage held at point A at the other side of the coil 40 from the side at which the battery voltage is applied is the so-called fly-back voltage generated by opening the transistor switch 46.

In operation, when the current 1 in the solenoid 40 is zero initially and the input to the control electronics 38 at set point input 32 calls for a non-zero value of current in the solenoid, both switches 44 and 46 close and current builds up in the solenoid coil 40 as determined by the battery voltage 42, $V_1$, the inductance of the solenoid 40, L, and the total resistance R in series with the coil 40. The current as a function of time can be described by the following equation:

$$I(t) = (V/R) * (1 - \text{EXP}(-t*R/L)) \qquad \text{equation (1)}$$

As the current is increasing through the solenoid 40 with both switches 44 and 46 closed, the current through the solenoid 40 is measured by current sensor 50 and is compared with the value of the set point input 32 by the control electronics 38. When the current is equal to the predetermined value of the set point 32, the control electronics 38 opens the switch 44. The current though the solenoid coil 40 continues flowing through the circuit comprising the coil 40, the (still closed) switch 46, and the diode 54. If the current at the moment that switch 44 is open is I, the reduction of current amplitude is given by:

$$I(t) = I_1 * EXP(t*R/L) - (V_d/R)*(1 - EXP(-t*R/L)) \quad \text{equation (2)}$$

where $V_d$ is the voltage drop across the diode, R is the resistance of the circuit, and L is the inductance of the coil 40. When the current though the solenoid 40, as measured by the current sensor 48, reaches the lower edge of the rather narrow control band of current though the solenoid 40, the control electronics 38 closes the switch 44 again and the current begins increasing according to the equation (1) given above. Thus, the current will cycle between the upper and lower values of the control band by opening and closing the switch 44, to thereby hold the value set by the set point 32. Current can be increased and decreased, in response to an increase or decrease in the set point input 32, by either opening or closing the switch 44 for a longer time period, until the current in the solenoid catches up with the set point. This cycling can occur indefinitely, as long as the required decrease in current does not exceed that rate permitted by equation (2) given above.

As discussed above, current decay in the solenoid 40 at a rate greater than that permitted by physical characteristics of the solenoid and circuit is required when the adaptive braking system calls for a pressure decay, when the vehicle operator releases the brakes, or when the pressure called for by the vehicle operator (the "set point") decreases at a rate faster than that permitted by the slow decay mode as discussed above. When this occurs, the control electronics 38 closes switch 44 and opens switch 46. The current still flowing through the solenoid 40 causes a voltage at point A to rise rapidly (because of the inductive fly-back voltage effect) and when the voltage at point A is equal to $k*V_{BAT}$ (where k is greater than 1) the voltage at point A is regulated by voltage referencing circuit 56, as will be described hereinafter, and is controlled by the control electronics. The flyback voltage generated by the current that remains flowing through the coil 40 at the instant that the switch 46 is closed and switch 44 is opened rapidly increases the voltage at point A to the point regulated by the voltage referencing circuit 56. Since the constant k is greater than 1, the higher voltage exists at point A than exists on the other side of the coil, such that the reverse voltage will quickly drive the current flowing through the coil 40 to 0, according to the law given by the following equation:

$$I(t) = I(0) * EXP(-t*R/L) - (k*V_{BAT}/R) * (1-EXP(-t*R/L))$$

Where I(O) is the current level at the beginning of the fast decay mode of operation, R is the resistance of the circuit, and L is the inductance of the coil 40. The current sensor 50 remains in the circuit and continu monitor the current during the fast decay mode because switch 46 is closed during decay. Once the current reaches the SET POINT on input 32 of the control electronics 38, switch 46 is closed, and switch 44 cycles as described above to regulate the current in the coil 40. However, if a fast decay command for the adaptive braking system is transmitted to the control electronics through input 34, or a signal indicating the operator released the brakes is received on input 36, the fast decay mode is held until the current is driven to 0. It should be noted that when the switch 46 is closed in the fast decay mode, current decays through the circuit comprising the coil 40 and the diode 54.

Figure 3:
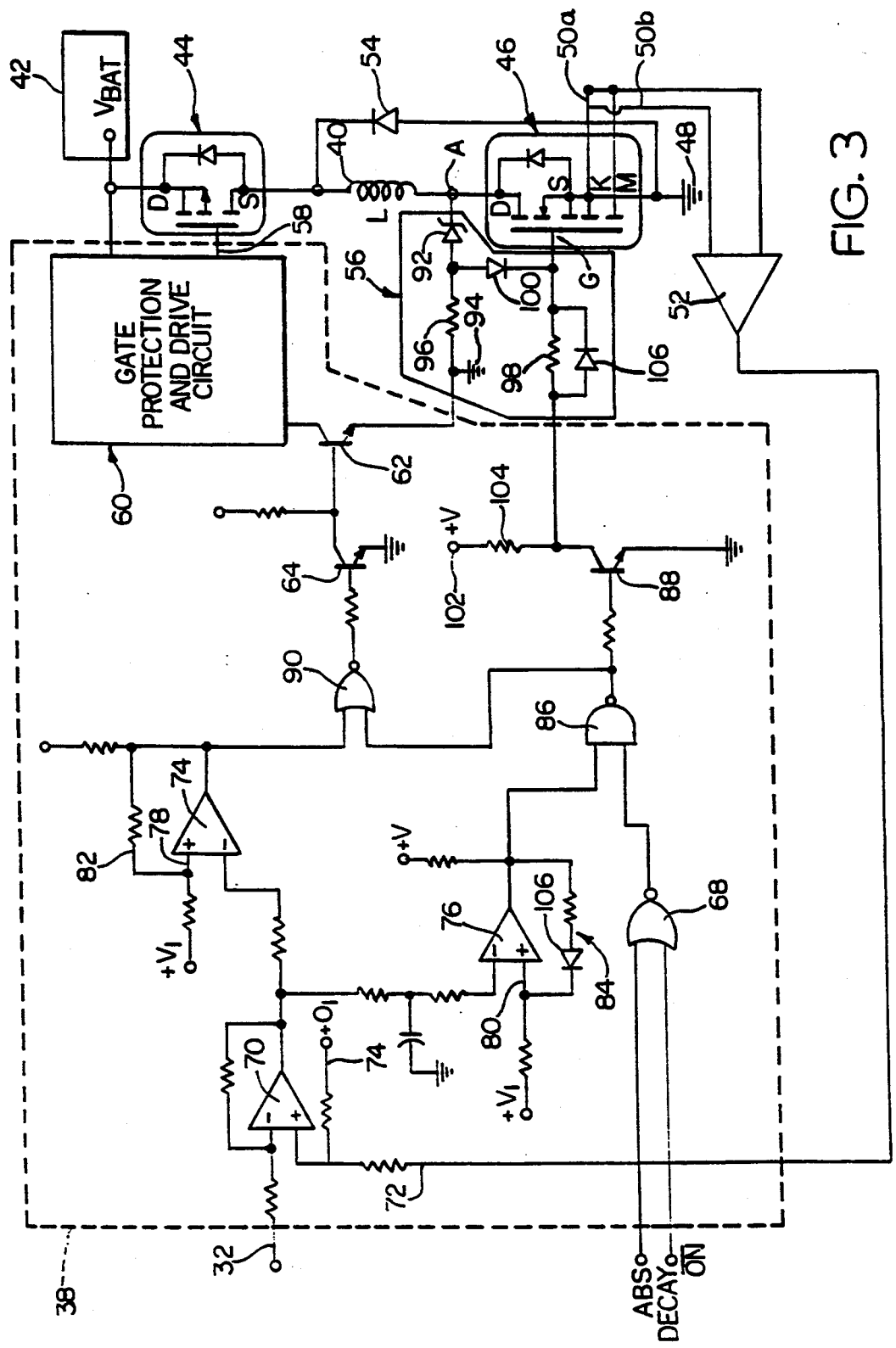
FIG. 3 is a detailed schematic of the solenoid control circuit illustrated in FIG. 2.

Referring to FIG. 3, the switch 44 is implemented as a MOSFET, which may be Motorola MTP12P10. The gate 58 of the switch 44 is controlled by a gate protection and drive circuit generally indicated by the numeral 60, which is connected with the battery voltage 42 and is controlled by switching transistors 62 and 64.

Input 36 becomes low when the brake treadle is activated and input 34 is low at all times except when the adaptive braking system calls for a brake pressure decay. Since when normal braking is effected both inputs 34 and 36 are low, the output of NOR gate 68 will be high. Operational amplifier 70 compares the value transmitted through SET POINT input 32 with the output of the amplifier 52 which generates the current feedback signal. When the SET POINT 32 is more positive than the feedback signal transmitted to input 72 of OP-AMP 70 by an amount equal to the + node voltage level at 74, 76 the output of comparators 74, 76 are both caused to go high. Both comparators 74, 76 have a positive input 78, 80 regulated by a conventional hysteresis circuit 82, 84 connected to between a high voltage level +V and a voltage level +V$_1$, thus setting a "dead band" requiring that the output of operational amplifier 70 go positive by a predetermined amount before the comparators 74, 76 are switched back off. The outputs of the comparator 76 and the NOR gate 68 are connected to a NAND gate 86. Accordingly, when the output of comparator 76 goes high, the output of NAND gate 86 goes low, thereby switching off transistor 88. The output of NAND gate 86 is connected to one input of a NOR gate 90. The other input of NOR gate 90 is connected to the output of comparator 74.

Accordingly, when the output of comparator 74 is high, the NOR gate 90 switches the transistor switch 44 on through the transistors 62, 64. Transistor switch 46 is switched on when transistor 88 is off. The gate of transistor 46 is driven positively by voltage V 102, through resistors 104 and 98 and diode 106. Transistor switch 46 combined with current sensors 50a, 50b is similar to Motorola MTP10N10M. The current through the solenoid 40 begins to build up, as given by equation (1) above. As the current builds up in the solenoid, the output of operational amplifier 52 becomes more positive causing the output of amplifier 70 to move toward or even exceed the reference level set at 74. When this occurs, the comparator 70 will switch its output from high to low, thereby turning off the switch 44. The current in the solenoid will continue to flow through the transistor switch 46 and diode 54 but the amplitude of the current will diminish as given in the equation above. As this occurs, the output of operational amplifier 52 will become smaller as the current diminishes, causing the error signal at the output of comparator 70 to diminish. Because of the hysteresis provided by circuit 82, the output of comparator 70 must become more negative such that the SET POINT value at terminal 32 must drop below the level provided by the hysteresis circuit 82 before the comparator 74 switches from low to high, thereby enabling the output of NOR gate 90 to become low which will turn transistor 44 on again. The cycle repeats as necessary to control current in the solenoid 40 during the slow decay mode within the hysteresis band set by the hysteresis circuit 82.

As discussed above, the current in the coil 40 must sometimes be forced to decay more quickly than that allowed by the normal decay of current in the solenoid 40. This fast decay mode is demanded when the inputs 34 or 36 go high, thereby indicating that the vehicle operator has either reduced the brakes or the adaptive braking system is calling for a rapid brake pressure decay. The fast decay mode is also necessary if the SET POINT input at terminal 32 is reduced more quickly than that allowed by the normal decay rate of the current in the solenoid 40 as discussed above.

If either of the inputs 34 or 36 go high, the output of NOR gate 68 switches to low, and the output of NAND gate 86 goes high. When the output of NAND gate 86 goes high, the transistor switch 46 is turned off, but transistor switch 44 will remain turned on through NOR gate 90 when the transistor switch 46 switches off. The voltage at point A will then rise very rapidly (due to the inductive fly-back voltage effect). When the voltage reaches a predetermined voltage level, Zener-diode 92 begins conducting. The circuit to ground at 94 through the Zener-diode 92 is completed through resistor 96. As the voltage at point A continues to increase, the voltage drop across resistor 96 will also continue to increase, and the current through the Zener-diode 92 will be divided between the resistors 96 and 98 through the diode 100. The normal off gate voltage is applied to the transistor switch 46 at the collector of transistor 88 which is at near ground potential at this time. As the fly-back voltage at point A increases a voltage level is applied to the gate terminal of transistor switch 46 through as determined by the Zener-diode 92 and diode 100. When this gate voltage increases to a predetermined level, transistor switch 46 turns back on, thus conducting the coil 40 with ground at 48. The voltage at point A before the transistor 46 turns back on is clamped at a constant k times $V_{BAT}$, where k is greater than 1 as discussed above. This voltage clamping level is governed and controlled by the Zener-diode 92 and the diode 100. Accordingly, before the transistor switch 46 switches back on, the voltage across the coil 40 is reversed, because the voltage at point A is higher than battery voltage, thus quickly driving the current in the coil 40 to 0. Once the current in coil 40 reaches 0, the voltage at point A collapses permitting the voltage applied to the gate of transistor switch 46 through the diodes 92 and 100 thereby turning the transistor switch 46 off. It should be remembered that throughout the foregoing operation, the transistor switch 44 remains on, because the output of NOR gate 90 remains positive.

The fast decay mode may also be initiated even if the inputs on 34 and 36 remain low, such as when the error signal at the output of operational amplifier 70 rapidly increases, thereby calling for a reduction in current in the solenoid 40 that is more rapid than can be accommodated during the slow decay mode of operation discussed above. When the error signal applied to comparator 76 becomes greater than the reference level applied to terminal 80 of comparator 76 by the circuit 84, the output of comparator 76 switches from high to low, causing the output of NAND gate 86 to switch from low to high, thus turning off transistor switch 46 and turning on transistor switch 44. The inductive fly-back voltage at a voltage level equal to $k*V_{BAT}$ is clamped at point A in exactly the same manner as described above. It will be noted that when the transistor switch 46 is switched on during this operation as discussed above, the current measured by the current sensing and amplified by operational amplifier 52 is still applied to comparator 70. When the magnitude of the error signal at the output of 70 becomes less than the reference level at 74, the output of comparator 76 switches from low to high, causing the output of NAND gate 86 to change from high to low, thus turning on transistor switch 46. In should be noted that comparator 76 has an asymmetric hysteresis band, so that when the output of comparator 76 is high, the error signal must be much greater than the reference level applied at terminal 80 in order to change the output state. This is so because if the output of 76 is high, because of the diode 106, the voltage applied to the terminal 80 is much greater than the voltage $V_1$ normally applied to the terminal 80 when the output of comparator 76 is low. When the output of comparator 76 switches to turn transistor switch 46 back on, the circuit is in the slow decay mode of operation discussed above. Accordingly, during the fast decay mode of operation, the solenoid current is reduced to a fast by uncontrolled rate, but as soon as the desired current level is reached, the linear mode of operation is reestablished.

We claim:

1. Brake pressure control mechanism for establishing a pressure level in a brake actuator, said mechanism including a valve controlled by a coil, actuation means for operating said valve, said actuation means including a circuit means for connecting a voltage source to said coil, said circuit means comprising: first control means for controlling electrical current in said coil to initiate a normal current decay mode when the required rate of current decay does not exceed a predetermined rate; second control means for causing a reversal in the voltage drop across said and thus initiating a fast current decay mode when the actuation means demands a decrease in current through said coil in excess of said predetermined rate; and a current sensor for generating a current feedback signal which varies in accordance with the current flow through the coil, said actuation means including means for comparing said current feedback signal and a current request signal representing a requested brake pressure level and generating a pressure decrease error signal when said feedback signal exceeds the current request signal by more than a preestablished amount, said first and second control means being responsive to said error signal for initiating said normal decay mode when the error signal is less than a predetermined level and for initiating said fast current decay mode when the error signal is greater than the predetermined level.

2. Brake pressure control mechanism as claimed in claim 1, wherein said first control means includes a first electrically operated switch means connected between said voltage source and one side of said coil and means for opening and closing said first switch means.

3. Brake pressure control mechanism as claimed in claim 2, wherein said second control means includes second electrically operated switch means connected between the other side of said coil and ground and means for opening and closing said second switch.

4. Brake pressure control mechanism as claimed in claim 3, wherein said second control means includes clamping means responsive to opening of said second switch for permitting the voltage at said other side of the coil to increase to a predetermined voltage level greater than the voltage level of said voltage source and then clamping the voltage level at said other side of said coil at said predetermined level until the current flow through the coil drops to a predecided level.

5. Brake pressure control mechanism as claimed in claim 4, wherein said circuit means includes a diode connected around said coil and said second switch to permit current in said coil to decay at said predetermined rate when said first switch is open and said second switch is closed.

6. Brake pressure control mechanism as claimed in claim 4, wherein said mechanism includes means for generating a brake pressure release signal when the vehicle operator releases the brakes of the vehicle, said second control means being responsible to said brake pressure release signal for opening said second switch in response thereto.

7. Brake pressure control mechanism as claimed in claim 4, wherein said mechanism includes an adaptive braking control circuit responsive to an incipient skidding condition of a wheel controlled by said brake actuator and generating a brake pressure exhaust signal when said incipient skidding condition is sensed, said second control means being responsive to said exhaust signal for opening said second switch in response thereto.

8. Brake pressure control mechanism as claimed in claim 1, wherein said mechanism includes an adaptive braking control circuit responsive to an incipient skidding condition of a wheel controlled by said brake actuator and generating a brake pressure exhaust signal when said incipient skidding condition is sensed, said second control means being responsive to said exhaust signal for initiating said fast current decay mode.

9. Brake pressure control mechanism as claimed in claim 1, wherein said mechanism includes means for generating a brake pressure release signal when the vehicle operator releases the brakes of the vehicle, said second control means being responsive to said brake pressure release signal for initiating said fast current decay mode.

10. Brake pressure control mechanism for establishing a pressure level in a brake actuator, said mechanism including a valve controlled by a coil, actuation means for operating said valve, said actuation means including circuit means for connecting a voltage source to said coil, said circuit means including first control means for controlling electrical current in said coil to initiate a normal current decay mode when the required rate of current decay does not exceed a predetermined rate, and second control means for initiating a fast current decay mode when the actuation means demands a decrease in current through said coil in excess of said predetermined rate; and a current sensor for generating a current feedback signal which varies in accordance with the current flow through the coil, said actuation means including means for comparing said current feedback signal and a current request signal representing a requested brake pressure level and for generating a pressure decrease error signal when said feedback signal exceeds said current request signal by more than a preestablished amount, said first and second control means being responsive to said error signal for initiating said normal decay mode when the error signal is less than a predetermined level and for initiating said fast current decay mode when the error signal is greater than the predetermined level.

11. Brake pressure control mechanism as claimed in claim 10, wherein said mechanism includes an adaptive braking control circuit responsive to an incipient skidding condition of a wheel controlled by said brake actuator and generating a brake pressure exhaust signal when said incipient skidding condition is sensed, said second control means being responsive to said exhaust signal for initiating said fast current decay mode.

12. Brake pressure control mechanism as claimed in claim 10, wherein said mechanism includes means for generating a brake pressure release signal when the vehicle operator releases the brakes of the vehicle, said second control means being responsive to said brake pressure release signal for initiating said fast current decay mode.

13. Brake pressure control mechanism for establishing a pressure level in a brake actuator, said mechanism including a valve controlled by a coil, actuation means for operating said valve, said actuation means including circuit means for connecting a voltage source to said coil, said circuit means including a current sensor for generating a current feedback signal which varies in accordance with the current flow through the coil, said actuation means including means for comparing said current feedback signal and a current request signal representing a requested brake pressure level and for generating a pressure decrease error signal when said current feedback signal exceed the current request signal by more than a preestablished amount, said first and second control means being responsive to said error signal for initiating said normal decay mode when the error signal is less than a predetermined level and for initiating said fast current decay mode when the error signal is greater than the predetermined level.

14. Brake pressure control mechanism as claimed in claim 13, wherein said mechanism includes an adaptive braking control circuit responsive to an incipient skidding condition of a wheel controlled by said brake actuator and generating a brake pressure exhaust signal and overriding said error signal when said incipient skidding condition is sensed.

15. Brake pressure control mechanism as claimed in claim 13, wherein said mechanism includes means for generating a brake pressure release signal when the vehicle operator releases the brakes of the vehicle and generating a brake pressure exhaust signal and overriding said error signal when the brake pressure release signal is generated.

* * * * *